United States Patent
Yang et al.

(10) Patent No.: US 9,425,089 B2
(45) Date of Patent: Aug. 23, 2016

(54) CONDUCTIVE ELEMENT STRUCTURE AND METHOD

(71) Applicant: Taiwan Semiconductor Manufacturing Company, Ltd., Hsin-Chu (TW)

(72) Inventors: Tai-I Yang, Hsin-Chu (TW); Hsiang-Wei Liu, Tainan (TW); Chia-Tien Wu, Taichung (TW); Hsiang-Huan Lee, Jhudong Township (TW); Tien-Lu Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 95 days.

(21) Appl. No.: 14/319,464

(22) Filed: Jun. 30, 2014

(65) Prior Publication Data

US 2015/0380303 A1    Dec. 31, 2015

(51) Int. Cl.
*H01L 21/768* (2006.01)
*H01L 21/311* (2006.01)
*H01L 21/02* (2006.01)
*H01L 21/3213* (2006.01)

(52) U.S. Cl.
CPC .... *H01L 21/76843* (2013.01); *H01L 21/02244* (2013.01); *H01L 21/31111* (2013.01); *H01L 21/31144* (2013.01); *H01L 21/32133* (2013.01); *H01L 21/76802* (2013.01); *H01L 21/76877* (2013.01); *H01L 21/02258* (2013.01)

(58) Field of Classification Search
CPC ............... H01L 2924/0002; H01L 2924/00; H01L 21/76843; H01L 21/76846; H01L 21/76849
USPC ........... 257/751, E21.495, E23.141, E23.161, 257/774, E21.577–E21.578, 257/E21.585–E21.588; 438/637–640, 668
See application file for complete search history.

(56) References Cited

U.S. PATENT DOCUMENTS

| | | | |
|---|---|---|---|
| 6,399,483 B1 * | 6/2002 | Liu | H01L 21/76808 257/E21.579 |
| 2004/0192058 A1 * | 9/2004 | Chu | H01L 21/76808 438/710 |
| 2006/0008200 A1 * | 1/2006 | Nakamura | G02B 26/001 385/15 |
| 2012/0080761 A1 * | 4/2012 | Hsieh | H01L 21/76898 257/414 |

* cited by examiner

*Primary Examiner* — David Vu
*Assistant Examiner* — Jonathan Han
(74) *Attorney, Agent, or Firm* — Slater & Matsil, LLP

(57) ABSTRACT

Conductive element structures and methods of manufacture thereof are disclosed. In some embodiments, a method of forming a conductive element in an insulating layer includes: forming a recess in a metal layer disposed over the insulating layer; selectively forming a metal liner on a sidewall of the recess; and etching a via in the insulating layer using the metal layer and the metal liner as a mask.

20 Claims, 16 Drawing Sheets

CONDUCTIVE ELEMENT STRUCTURE AND METHOD

BACKGROUND

As consumer devices have gotten smaller and smaller in response to consumer demand, the individual components of these devices have decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photolithographic materials. Such materials are applied to a surface and then exposed to an energy that has itself been patterned. Such an exposure modifies the chemical and physical properties of the exposed regions of the photolithographic material.

However, as the size of individual devices has decreased, process windows for photolithographic processing have become tighter and tighter. As such, methods that can keep up the ability to scale down the devices and meet the desired design criteria are needed such that the march towards smaller and smaller components may be maintained.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
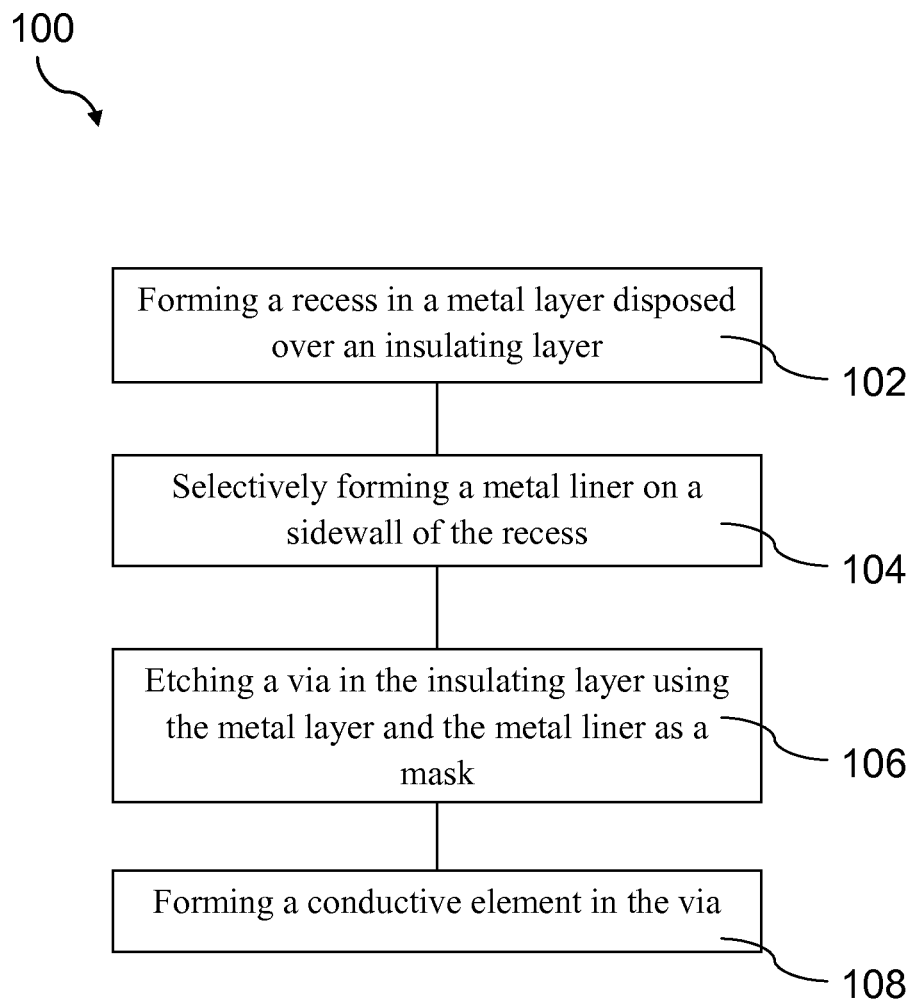
FIG. 1 shows a method of forming a conductive element in an insulating layer, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 shows a method 100 of forming a conductive element in an insulating layer, in accordance with one or more embodiments. The method 100 may include forming a recess in a metal layer disposed over an insulating layer (in 102); selectively forming a metal liner on a sidewall of the recess (in 104); and etching a via in the insulating layer using the metal layer and the metal liner as a mask (in 106). The method 100 further includes forming a conductive element in the via (in 108).

FIG. 2A to FIG. 2F show a process flow illustrating the method 100 shown in FIG. 1, in accordance with one or more embodiments. The process flow in FIG. 2A to FIG. 2F may, for example, be identified with a single damascene process and may show some of the process steps in manufacturing a semiconductor device.

Figure 2A:
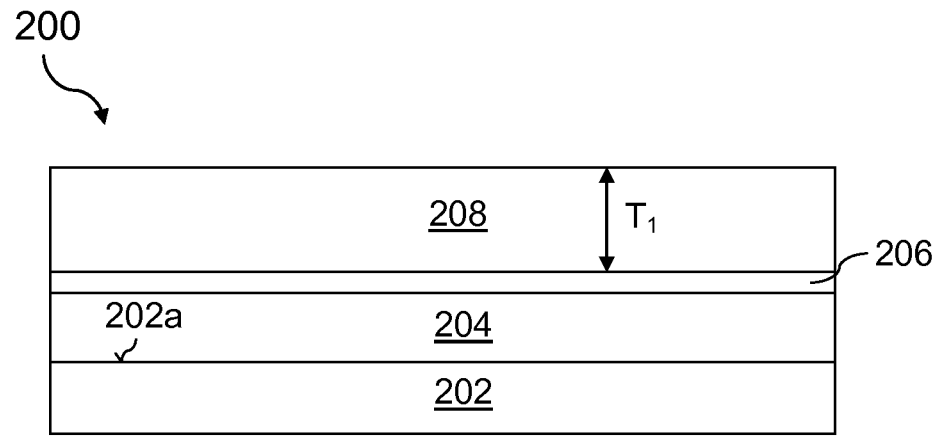
FIG. 2A to FIG. 2F and FIG. 3A to FIG. 3F show process flows illustrating the method shown in FIG. 1, in accordance with some embodiments.

As shown in FIG. 2A, a workpiece 200 may be provided. The workpiece 200 may include a semiconductor substrate layer 202, an insulating layer 204, an etch stop layer 206, and a metal layer 208. The semiconductor substrate layer 202 may include, or may be, a semiconductor substrate. The semiconductor substrate may include, or may be, a silicon substrate. Alternatively, the semiconductor substrate layer 202 may include, or may consist of, another elementary semiconductor material (such as germanium); a compound semiconductor material (including silicon carbide, gallium arsenic, gallium phosphide, indium phosphide, indium arsenide, and/or indium antimonide); an alloy semiconductor material (including SiGe, GaAsP, AlInAs, AlGaAs, GaInAs, GaInP, and/or GaInAsP); or combinations thereof.

In an embodiment, the semiconductor substrate layer 202 may include, or may be, a semiconductor on insulator (SOI) substrate. The SOI substrate may include a buried oxide (BOX) layer formed by a process such as separation by implanted oxygen (SIMOX), and/or other suitable processes. Further, the semiconductor substrate layer 202 may include an epitaxial layer (epi-layer) that may, for example, be strained for performance enhancement. The semiconductor substrate layer 202 may include at least one circuit element (not shown in FIG. 2A) that may be formed in or on the semiconductor substrate layer 202. For example, the at least one circuit element may include, or may be, at least one of a transistor, a resistor, a capacitor, and an inductor, although other circuit elements may be possible as well.

The insulating layer 204 may be disposed over the semiconductor substrate layer 202 (e.g. over a top surface 202a of the semiconductor substrate layer 202). The insulating layer 204 may be formed by chemical vapor deposition (CVD), physical vapor deposition (PVD), atomic layer deposition (ALD), a spin-on-dielectric process, combinations thereof, or the like. The insulating layer 204 may include, or may consist of, a dielectric material and may be an interlayer dielectric (ILD) layer. The insulating layer 204 may include one or more layers (e.g. one or more ILD layers). In other words, the insulating layer 204 may include, or may be, a single layer structure (e.g. including one layer of insulating material) or a multilayer structure (e.g. including two or more layers of insulating material). The insulating layer 204 may include, or may consist of, at least one of silicon dioxide, fluorinated silicon glass (FSG), SILK (a product of Dow Chemical of Michigan), BLACK DIAMOND (a product of Applied Materials of Santa Clara, Calif.), although other insulating materials may be possible as well.

The etch stop layer 206 may be disposed over the insulating layer 204, and the metal layer 208 may be disposed over the etch stop layer 206, as shown in the example of FIG. 2A. The etch stop layer 206 may prevent etching of the underlying insulating layer 204 during an etch process that may be applied to the metal layer 208. The etch stop layer 206 may be formed over the insulating layer 204 by a deposition process, e.g. CVD, PVD, spin coating, combinations thereof, or the like.

In an embodiment, the etch stop layer 206 may include, or may consist of, TiN or TiO. In another embodiment, the etch stop layer 206 may include, or may consist of, suitable metallic compounds like TaN, NiSi, CoSi, combinations thereof, or the like. The etch stop layer 206 may have a thickness in a range from about 150 Å to about 400 Å, although other thicknesses may be possible as well.

The metal layer 208 on the etch stop layer 206 may function as a metal hard mask during an etch process that may be applied to the underlying insulating layer 204 and etch stop layer 206. The metal layer 208 may be formed over the etch stop layer 206 by an electro-chemical plating process, CVD, ALD, PVD, combinations thereof, or the like. The metal layer 208 may include a conductive material. For example, the metal layer 208 may include, or may consist of, at least one of aluminum, cobalt, titanium, and copper, although other metals or metal alloys may be possible as well. For example, in an embodiment, the metal layer 208 may include, or may consist of, suitable metallic compounds like TiN, TaN, NiSi, CoSi, or the like. A thickness $T_1$ of the metal layer 208 may be in a range from about 100 Å to about 500 Å, although other thicknesses may be possible as well.

Figure 2B:
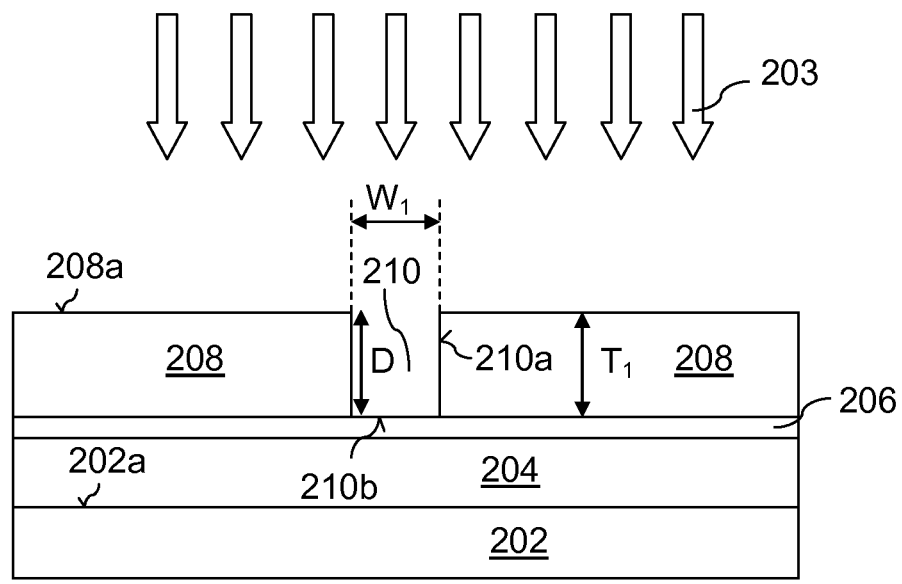

As shown in FIG. 2B, a first recess 210 may be formed in the metal layer 208 by means of an etch process 203. In forming the first recess 210, a patterned etch mask (not illustrated in FIG. 2B) may first be formed over a portion of a top surface 208a of the metal layer 208. The patterned etch mask may be formed by coating a masking material (e.g. a photoresist) over the top surface 208a of the metal layer 208, and patterning the masking material to form the patterned etch mask. Patterning the masking material may include, or may consist of, a lithographic process (e.g. a photo-lithographic process). Thereafter, the etch process 203 may be applied in cooperation with the patterned etch mask to form the first recess 210. The etch process 203 may applied until a portion of a surface of the etch stop layer 206 is exposed. The etch stop layer 206 may prevent etching of the underlying insulating layer 204 during application of the etch process 203. The patterned etch mask may be removed after forming the first recess 210.

In an embodiment in which the metal layer 208 includes, or consists of, aluminum, the etch process 203 may be a reactive ion etch and may include an etch process chemistry including, or consisting of, a chlorine containing etchant, such as $Cl_x$ (e.g. $Cl_2$), although other etch process chemistries may be possible as well in accordance with other embodiments. The etch process 203 may include a flow rate (e.g. an etchant flow rate) in a range from about 10 standard cubic centimeters per minute (sccm) to about 200 sccm, and may be performed at a pressure in a range from about 100 mT to about 500 mT. The etch process 203 may include provision of electrical power in a range from about 10 Watts to about 500 Watts.

The first recess 210 may be disposed at the top surface 208a of the metal layer 208. For example, a mouth of the first recess 210 may be disposed at the top surface 208a of the metal layer 208 and may extend into the metal layer 208. The first recess 210 may include at least one sidewall 210a and a bottom surface 210b. A depth D of the first recess 210 may, for example, be measured from the mouth of the first recess 210 to the bottom surface 210b of the first recess 210. The depth D of the first recess 210 may be substantially equal to the thickness $T_1$ of the metal layer 208. As in the example shown in FIG. 2B, the at least one sidewall 210a of the first recess 210 may be substantially straight. In other words, the at least one sidewall 210a of the first recess 210 may be substantially perpendicular to the bottom surface 210b of the first recess 210.

The first recess 210 may have a first width $W_1$ that may, for example, be measured as the widest lateral extent of the first recess 210. For example, the first width $W_1$ may be measured as the distance between opposite sidewalls of the first recess 210, as shown in FIG. 2B. The first width $W_1$ may be in the range from about 20 nm to about 60 nm (e.g. about 40 nm), although other values may be possible as well. The first width $W_1$ may be the smallest attainable lateral extent of the first recess 210 using the patterning process described above with respect to FIG. 2B. In other words, the first width $W_1$ may be the critical dimension of the first recess 210 for the patterning process.

Figure 2C:
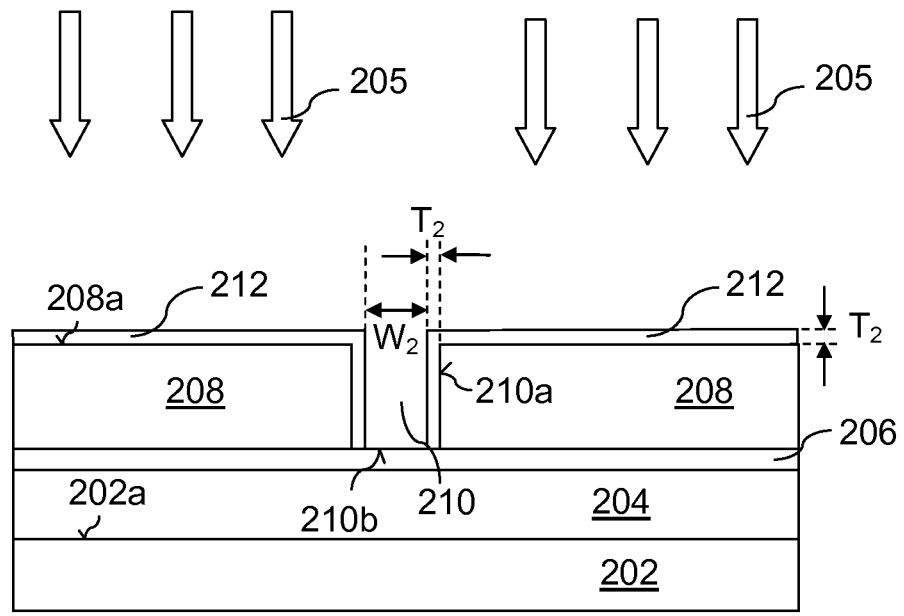

As shown in FIG. 2C, a metal liner 212 may be selectively formed on the at least one sidewall 210a of the first recess 210 by a selective process 205. In other words, the metal liner 212 may be formed on the conductive material of the metal layer 208, but not on the bottom surface 210b of the first recess 210. Stated in yet another way, the metal liner 212 may only be formed over surfaces of the metal layer 208. The metal liner 212 on the at least one sidewall 210a of the first recess 210 may be substantially straight. In other words, the metal liner 212 on the at least one sidewall 210a of the first recess 210 may be substantially perpendicular to the bottom surface 210b of the first recess 210, as shown in the example of FIG. 2C. The metal liner 212 functions as a self-aligned metal spacer during an etch process that may be applied to the underlying insulating layer 204 and etch stop layer 206.

A thickness $T_2$ of the metal liner 212 may be measured in a lateral direction, e.g. from the at least one sidewall 210a of the first recess 210. The thickness $T_2$ of the metal liner 212 may be in a range from about 50 Angstroms to about 150 Angstroms, although other thicknesses may be possible as well. Accordingly, selectively forming the metal liner 212 on the surfaces of the metal layer 208 may shrink the first width $W_1$ by about 10 nm (50 Å×2 sidewalls) to about 30 nm (150 Å×2 sidewalls). Stated differently, by selectively forming the metal liner 212 over the surfaces of the metal layer 208, the first width $W_1$ may be reduced to a second width $W_2$, which may be in a range from about 5 nm to about 20 nm, e.g. in a range from about 5 nm to about 15 nm. A width (e.g. a lateral extent) of a feature (e.g. a via) that may be formed in the insulating layer 204 may depend at least in part on the second width $W_2$. The metal liner 212 may include, or may consist of, at least one of aluminum, cobalt, titanium, ruthenium, and copper, although other metals or metal alloys may be possible as well.

In an embodiment, the selective process 205 may include, or may be, a selective plating process or a selective CVD process. In another embodiment, the selective process may include, or may be, a selective deposition and oxidization process. The selective process 205 forms the metal liner 212 on the conductive material of the metal layer 208, but not on the surface of the etch stop layer 206 exposed by the first recess 210. Such a selective formation of the metal liner 212 on the metal layer 208 may be due to a difference in the composition of the metal layer 208 and the etch stop layer 206. In particular, the conductive material of the metal layer 208 may be able to provide a chemical potential (e.g. a redox potential) that is different from the etch stop layer 206 and that is sufficient to cause a chemical reaction (e.g. a reduction) to occur thereon, thus forming the material of the metal liner 212. Consequently, material of the metal liner 212 may be selectively formed on the conductive material of the metal layer 208.

In an embodiment in which the metal liner 212 includes, or consists of, aluminum and in which the selective process 205 is a selective plating process, the selective process 205 may include $AlCl_3$-1-ethyl-3-methylimidaolium in solution having a concentration in a range from about 20 mole percent to about 40 mole percent along with $AlCl_3$ in solution having a concentration in a range from about 50 mole percent to about 70 mole percent. The selective process 205 may further include applying a voltage in a range from about −0.1 V to about −0.2 V to the metal layer 208 and/or passing a current having a current density in a range from about 1.5 $mA/cm^2$ to about 2.0 $mA/cm^2$ through the metal layer 208. The selective process 205 may be performed at a temperature in a range from about 20 degrees Celsius to about 40 degrees Celsius and at a pressure in a range from about 800 Pa to about 1000 Pa.

In an embodiment in which the metal liner 212 includes, or consists of, copper and in which the selective process 205 is a selective plating process, the selective process 205 may include $CuSO_4$ and $NaSO_4$ in solution. The selective process 205 may further include applying a voltage in a range from about −0.1 V to about −1 V to the metal layer 208 and/or passing a current having a current density in a range from about 1.0 $mA/cm^2$ to about 5.0 $mA/cm^2$ through the metal layer 208. The selective process 205 may be performed at a temperature in a range from about 10 degrees Celsius to about 40 degrees Celsius and at a pressure in a range from about 50 kPa to about 150 kPa.

In an embodiment in which the selective process 205 is a selective deposition and oxidization process, a metal or metal alloy may be deposited on the surfaces of the metal layer 208 and subsequently oxidized by an oxidization process. In an embodiment, the oxidization process may include an anodic metal oxidization process. In a particular embodiment, the metal liner 212 may consist of $Al_2O_3$. In this particular example, aluminum may be selectively deposited (e.g. by a plating process) on surfaces of the metal layer 208 exposed to the selective process 205. In other words, the exposed surfaces of the metal layer 208 may be capped with aluminum by utilizing a difference in chemical potential (e.g. redox potential) between the metal layer 208 and the etch stop layer 206.

Once the aluminum has been formed, anodic metal oxidization of the deposited aluminum may be done by exposing the aluminum to oxalic acid in solution having a concentration in a range from about 0.2 molarity to about 0.4 molarity, e.g. about 0.3 molarity. The anodic metal oxidization process may further include applying a voltage in a range from about 30 V to about 50 V to the metal layer 208, and may be performed at a temperature in a range from about 10 degrees Celsius to about 20 degrees Celsius. In so doing, the metal liner 212 consisting of $Al_2O_3$ is formed on the surfaces of the metal layer 208. The anodic metal oxidization process may also result in the surfaces of the metal liner 212 being terminated after combining with oxygen.

In another particular embodiment, the metal liner 212 may consist of $CuO_2$. The selective process 205 may include deposition of copper on the surfaces of the metal layer 208, e.g. by a selective plating process. In other words, the exposed surfaces of the metal layer 208 may be capped with copper by utilizing a difference in chemical potential (e.g. redox potential) between the metal layer 208 and the etch stop layer 206.

Once the copper has been formed, anodic metal oxidization of the deposited copper may be done by exposing the copper to NaCl and NaOH in solution having a concentration in a range from about 0.1 molarity to about 0.5 molarity (e.g. about 0.3 molarity). The anodic metal oxidization process may further include applying a voltage in a range from about 30 V to about 50 V to the metal layer 208, and may be performed at a temperature in a range from about 50 degrees Celsius to about 90 degrees Celsius. In so doing, the metal liner 212 consisting of $CuO_2$ is formed on the surfaces of the metal layer 208. The anodic metal oxidization process may also result in the surfaces of the metal liner 212 being after combining with oxygen.

Figure 2D:
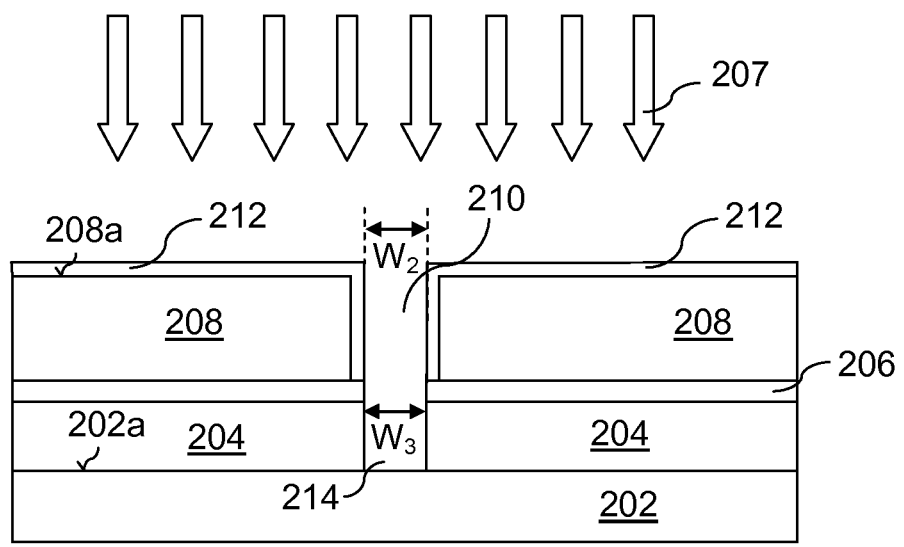

As shown in FIG. 2D, a via 214 may be etched in the insulating layer 204 by means of an etch process 207, using the metal layer 208 and the metal liner 212 as a mask. In other words, a pattern formed by the metal layer 208 and the metal liner 212 may be transferred to the insulating layer 204. Stated in yet another way, the first recess 210 having the second width $W_2$ may be extended into the insulating layer 204 to form the via 214 in the insulating layer 204. The via 214 in the insulating layer 204 may expose a portion of the top surface 202a of the semiconductor substrate layer 202.

The via 214 formed in the insulating layer 204 may have a third width $W_3$ that may be substantially equal to the second width $W_2$. Accordingly, by shrinking the first width $W_1$ to the second width $W_2$, and by extending the first recess 210 having the second width $W_2$ into the insulating layer 204, a critical dimension of the via 214 for the process flow shown in FIG. 2A to FIG. 2D may be smaller than the critical dimension of a via formed by a lithographic process. The critical dimension of the via 214 for the process flow shown in FIG. 2A to FIG. 2D depends at least in part on the thickness $T_2$ of the metal liner 212. Accordingly, the critical dimension of the via 214 for the process flow shown in FIG. 2A to FIG. 2D may be controlled by adjusting the thickness $T_2$ of the metal liner 212, which may, in turn, be varied by controlling the amount of material that is selectively formed on the metal layer 208 during the selective process 205. This may, for example, be controlled by varying the process parameters of the selective process 205, e.g., concentrations of solutions, voltage, current density, temperature, pressure, and duration of the selective process 205.

The etch process 207 may include, or may be, a dry etch process including one or more chemical reagents. For example, the etch process 207 may include at least one first chemical reagent for etching through the etch stop layer 206.

The etch process 207 may further include at least one second chemical reagent for etching through the insulating layer 204.

In a particular embodiment in which the etch stop layer 206 includes, or consists of, TiN or TiO, the at least one first chemical reagent of the etch process 207 may include, or may be, a gaseous etchant containing fluorine, such as $C_xF_y$ or $F_z$. A flow rate of the at least one first chemical reagent may be in a range from about 10 standard cubic centimeters per minute (sccm) to about 200 sccm, and may be at pressure in a range from about 100 mT to about 500 mT. The etch process 207 may include provision of electrical power in a range from about 10 Watts to about 500 Watts for etching through the etch stop layer 206.

The second chemical reagent of the etch process 207 (for etching through the insulating layer 204) may include, or may be, a gaseous etchant containing at least one of fluorine and hydrogen, such as $H_2$, $C_xF_y$, $C_xH_yF_z$ or $F_x$. A pressure of the at least one second chemical reagent may be in a range from about 100 mT to about 500 mT. The etch process 207 may include provision of electrical power in a range from about 10 Watts to about 2000 Watts for etching through the insulating layer 204.

Figure 2E:
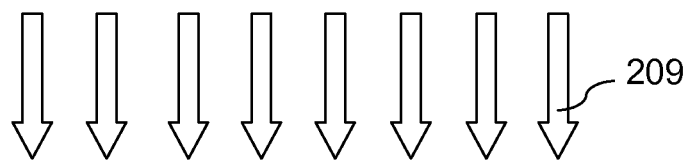
Figure 2E:
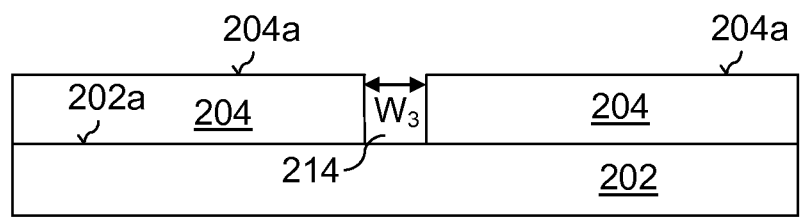

As shown in FIG. 2E, the metal liner 212, the metal layer 208, and the etch stop layer 206 may be removed by one or more stripping processes 209 to expose a top surface 204a of the insulating layer 204. The one or more stripping processes 209 may include one or more chemical reagents to strip the metal liner 212, the metal layer 208, and the etch stop layer 206, e.g. in sequence. The one or more chemical reagents may be chosen such that the insulating layer 204 is substantially unperturbed. In other words, material of the metal liner 212, the metal layer 208, and the etch stop layer 206 may be removed while maintaining the integrity of the insulating layer 204.

For example, in an embodiment in which the metal liner 212 and the metal layer 208 includes, or consists of, aluminum, the one or more chemical reagents of the one or more stripping processes 209 may include phosphoric acid. The phosphoric acid may remove the aluminum contained in the metal liner 212 and the metal layer 208. A temperature of the one or more stripping processes 209 including phosphoric acid may be in a range from about 24 degrees Celsius to about 45 degrees Celsius.

In another embodiment in which the metal liner 212 and the metal layer 208 includes, or consists of, copper, the one or more chemical reagents of the one or more stripping processes 209 may include at least one of $FeCl_3$ and HCl. The $FeCl_3$ and/or HCl may remove the copper contained in the metal liner 212 and the metal layer 208. A temperature of the one or more stripping processes 209 including $FeCl_3$ and/or HCl may be in a range from about 20 degrees Celsius to about 60 degrees Celsius. The one or more chemical reagents of the one or more stripping processes 209 may include hydrogen peroxide. The hydrogen peroxide may remove the etch stop layer 206.

Figure 2F:
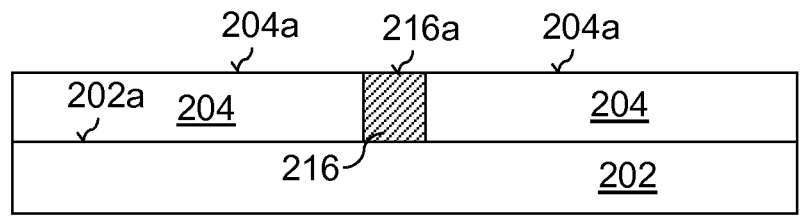

As shown in FIG. 2F, a conductive element 216 may be formed in the via 214. In other words, the via 214 may be filled with a conductive material. The conductive material of the conductive element 216 may include, or may consist of, copper, tungsten, titanium, tantalum, chromium, platinum, silver, gold, combinations thereof, or the like. Additionally, the conductive material may include one or more barrier material layers that may line the via 214. The one or more barrier material layers, which may include, or may consist of, suitable metallic compounds like TiN, TaN, NiSi, CoSi, combinations thereof, or the like.

Filling the via 214 with the conductive material may include first depositing a seed layer (not shown in FIG. 2F) and electrochemically plating the via 214 with the conductive material. The conductive material may overfill the via 214, e.g. such that the conductive material overlies the top surface 204a of the insulating layer 204. A chemical mechanical polish (CMP) may be performed to remove excess portions of the conductive material over the insulating layer 204, e.g. such that a top surface 216a of the conductive element 216 is substantially co-planar with the top surface 204a of the insulating layer 204.

As seen in the process flow in FIG. 2A to FIG. 2F, by using the metal layer 208 (which functions as a metal hard mask) and the metal liner 212 (which functions as a self-aligned metal spacer), the critical dimension of features formed in the insulating layer 204 can be reduced without the need for a spacer etch back process or for lithography on a spacer, which are needed in a process flow that has a dielectric hard mask and/or a dielectric spacer. Etch back or lithographic processes can adversely affect a profile (e.g. straightness) of the dielectric hard mask and the dielectric spacer and consequently, the critical dimension of features formed below the dielectric hard mask and the dielectric spacer. Therefore, by using the metal layer 208 and the metal liner 212 in the process flow shown in FIG. 2A to FIG. 2F, the profile (e.g. straightness) of the metal hard mask and metal spacer is preserved, the critical dimension of features (e.g. the via 214) formed below the metal hard mask and metal spacer is improved, and the process flow can be easily integrated in a manufacturing process.

FIG. 3A to FIG. 3F show a process flow illustrating the method 100 shown in FIG. 1, in accordance with another embodiment. The process flow shown in FIG. 3A to FIG. 3F may be identified with a dual damascene process, e.g. in which an upper portion of the via 214 (e.g. a portion of the via 214 proximate the top surface 204a of the insulating layer 204) may be widened to form a trench.

Figure 3A:
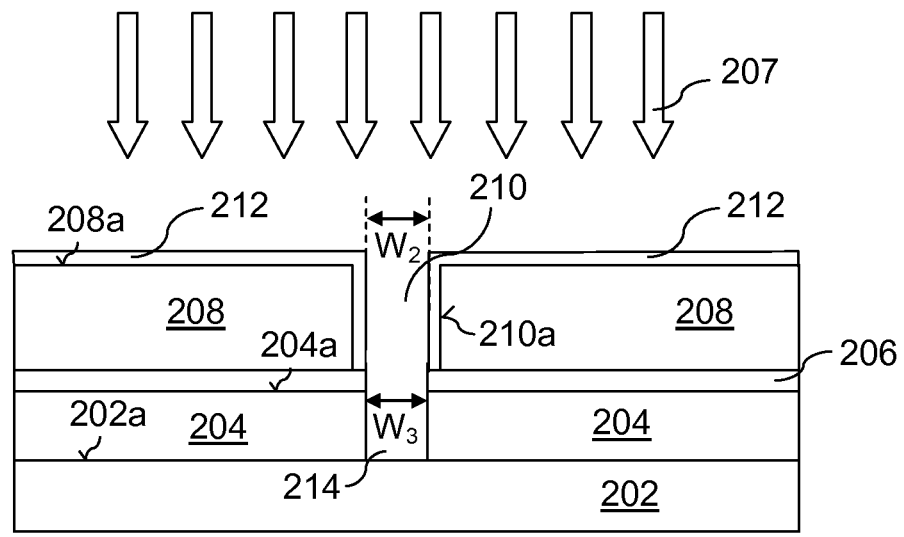

FIG. 3A shows the via 214 that may be etched in the insulating layer 204 by the etch process 207, using the metal layer 208 and the metal liner 212 as a mask. FIG. 3A may, for example, be identified with FIG. 2D.

Figure 3B:
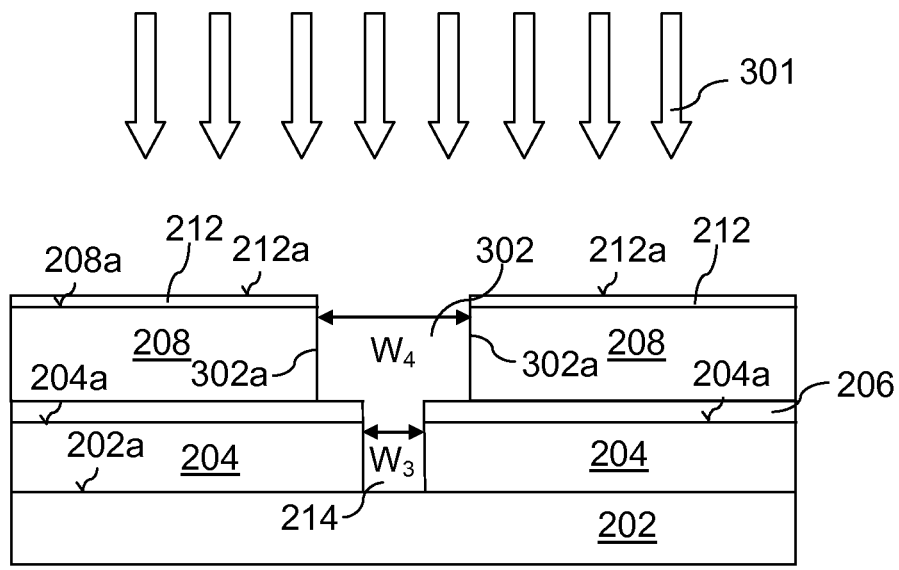

As shown in FIG. 3B, the first recess 210 may be widened by an etch process 301 to form a widened first recess 302 having a fourth width $W_4$. The fourth width $W_4$ may be measured as the distance between opposite sidewalls 302a of the widened first recess 302. The fourth width $W_4$ may be greater than the first width $W_1$ (see FIG. 2B). For example, the fourth width $W_4$ may be in a range from about 20 nm to about 60 nm, although other widths may be possible as well.

The etch process 301 may, for example, be similar to the etch process 203 described above in respect of FIG. 2B. In particular, in forming the widened first recess 302, a patterned etch mask (not illustrated in FIG. 3B) may first be formed over a portion of a top surface 212a of the metal liner 212. The patterned etch mask may be formed by coating a masking material (e.g. a photoresist) over the top surface 212a of the metal liner 212, and patterning the masking material to form the patterned etch mask. Patterning the masking material may include, or may consist of, a lithographic process (e.g. a photo-lithographic process). Thereafter, the etch process 301 may be applied in cooperation with the patterned etch mask to remove portions of the metal liner 212 and the metal layer 208. The etch process 301 may applied until a portion of a surface of the etch stop layer 206 is exposed. The etch stop layer 206 may prevent etching of the underlying insulating layer 204 during application of the etch process 301. The patterned etch mask may be removed after forming the widened first recess 302.

Figure 3C:
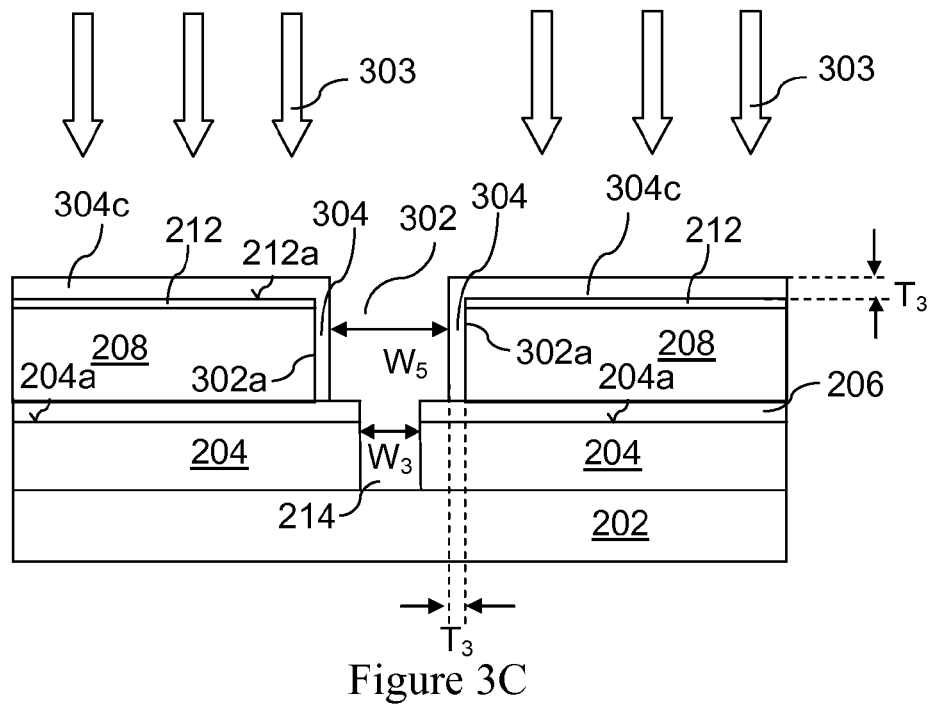

As shown in FIG. 3C, a first metal spacer 304 may be selectively formed on the sidewalls 302a of the widened first recess 302 by a selective process 303. In other words, the first metal spacer 304 may be formed on the conductive material of the metal layer 208, but not cover the etch stop layer 206. Stated in yet another way, the first metal spacer 304 may only be formed over surfaces of the metal layer 208. The selective process 303 may simultaneously form a conductive layer 304c over the top surface 212a of the metal liner 212.

The first metal spacer 304 on the sidewall 302a of the widened first recess 302 may be substantially straight. In other words, the first metal spacer 304 on the sidewall 302a of the widened first recess 302 may be substantially perpendicular to the underlying etch stop layer 206, as shown in the example of FIG. 3C. The first metal spacer 304 may function as a self-aligned metal spacer during an etch process that may be applied at a later process step to widen the upper portion of the via 214.

A thickness $T_3$ of the first metal spacer 304 and the conductive layer 304c may be measured in a lateral direction, e.g. from the sidewall 302a of the widened first recess 302 or from the top surface 212a of the metal liner 212. The thickness $T_3$ of the first metal spacer 304 and the conductive layer 304c may be in a range from about 100 Angstroms to about 300 Angstroms, although other thicknesses may be possible as well. Accordingly, selectively forming the first metal spacer 304 on the surfaces of the metal layer 208 may shrink the fourth width $W_4$ by about 20 nm (100 Å×2 sidewalls) to about 60 nm (300 Å×2 sidewalls). Stated differently, by selectively forming the first metal spacer 304 over the surfaces of the metal layer 208, the fourth width $W_4$ may be reduced to a fifth width $W_5$, which may be in a range from about 5 nm to about 30 nm. A width (e.g. a lateral extent) of a feature (e.g. a trench) that may be formed in the insulating layer 204 may depend at least in part on the fifth width $W_5$. The first metal spacer 304 may include, or may consist of, similar materials as the metal liner 212.

The selective process 303 may include, or may be, a selective deposition and oxidization process. For example, the selective process 303 may include selectively depositing a metal or metal alloy (e.g. containing aluminum or copper) over the surfaces of the metal layer 208 and the metal liner 212. The deposited metal or metal alloy may subsequently be oxidized (e.g. to form $Al_2O_3$ or $CuO_2$). The oxidization process of the selective process 303 may include, or may be, an anodic metal oxidization process. Process parameters and chemical reagents for the selective process 303 may be similar to the process parameters and chemical reagents of the embodiment of selective process 205 (described above with respect to FIG. 2C) including the selective deposition and oxidization process.

Figure 3D:
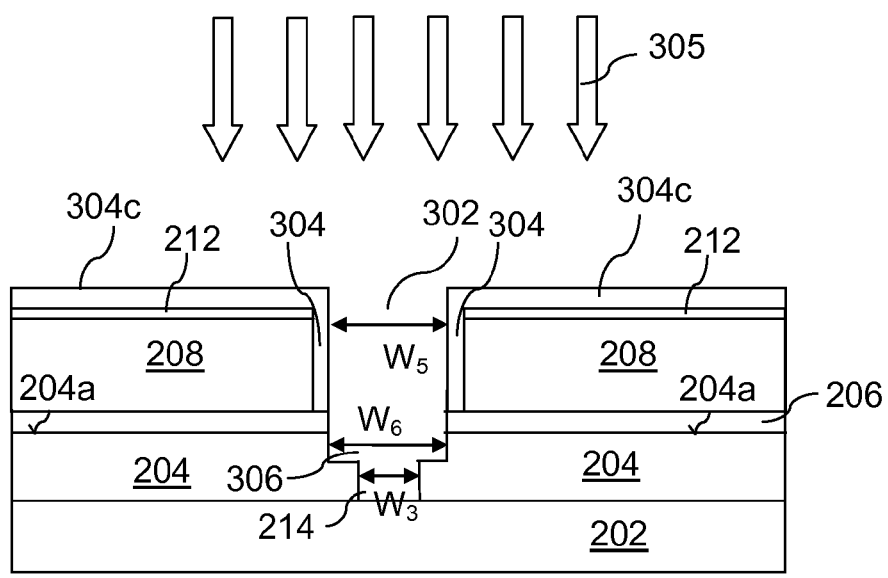

As shown in FIG. 3D, a trench 306 may be etched in a portion of the insulating layer 204 by means of an etch process 305, using the metal layer 208 and the first metal spacer 304 as a mask. In other words, a pattern formed by the metal layer 208 and the first metal spacer 304 may be transferred to the insulating layer 204. Stated in yet another way, the widened first recess 302 having the fifth width $W_5$ may be extended into a portion of the insulating layer 204. The trench 306 formed in the insulating layer 204 may have a sixth width $W_6$, which may be substantially equal to the fifth width $W_5$. The trench 306 may be formed by widening the upper portion of the via 214 (e.g. the portion of the via 214 proximate the top surface 204a of the insulating layer 204).

The etch process 305 may include, or may be, a dry etch process including one or more chemical reagents. For example, the etch process 305 may include at least one first chemical reagent for etching through the etch stop layer 206 and may include at least one second chemical reagent for etching through a portion of the insulating layer 204. The at least one first and second chemical reagents of the etch process 305 may be similar to the at least one first and second chemical reagents of the etch process 207. Process parameters of the etch process 305 may be similar to process parameters of the etch process 207 (described above with respect to FIG. 2D).

The sixth width $W_6$ and the fifth width $W_5$ depend at least in part on the thickness $T_3$ of the first metal spacer 304. Accordingly, the sixth width $W_6$ and the fifth width $W_5$ may be controlled by adjusting the thickness $T_3$ of the first metal spacer 304, which may, in turn, be varied by controlling the amount of material that is selectively formed on the sidewalls 302a of the widened first recess 302 during the selective process 303. This may, for example, be controlled by varying the process parameters of the selective process 303, e.g., concentrations of solutions, voltage, current density, temperature, pressure, and duration of the selective process 303.

Figure 3E:
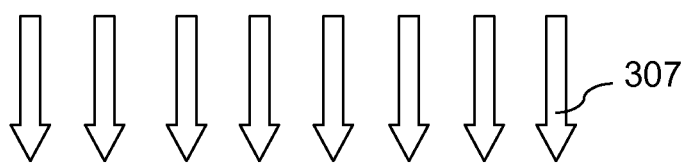
Figure 3E:
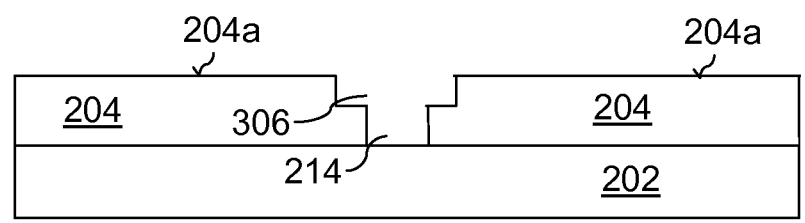

As shown in FIG. 3E, the first metal spacer 304, the metal liner 212, the metal layer 208, and the etch stop layer 206 may be removed by one or more stripping processes 307 to expose the top surface 204a of the insulating layer 204. The one or more stripping processes 307 may include one or more chemical reagents to strip the first metal spacer 304, the metal liner 212, the metal layer 208, and the etch stop layer 206, e.g. in sequence. The one or more chemical reagents of the one or more stripping processes 307 may be similar to the one or more chemical reagents of the one or more stripping processes 209 (described above with respect to FIG. 2E). Process parameters of the one or more stripping processes 307 may be similar to process parameters of the one or more stripping processes 209.

Figure 3F:
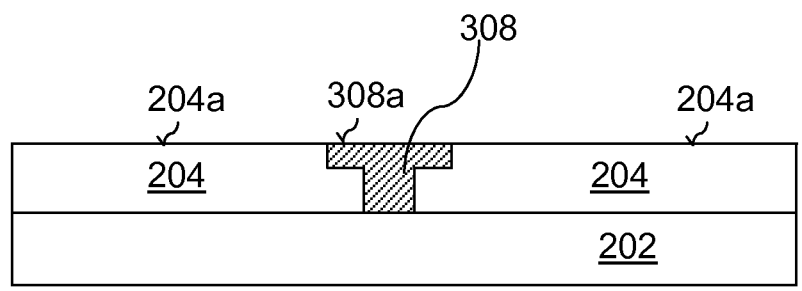

As shown in FIG. 3F, a conductive element 308 may be formed in the via 214 and the trench 306. In other words, the via 214 and the trench 306 may be filled with a conductive material. The conductive material of the conductive element 308 may be similar to the conductive material of the conductive element 216. The conductive element 308 may include one or more barrier material layers that may line the via 214 and the trench 306. The one or more barrier material layers of the conductive element 308 may include, or consist of, similar materials as the one or more barrier material layers of the conductive element 216.

The process of filling the via 214 and the trench 306 with conductive material may include first depositing a seed layer (not shown in FIG. 3F) and electrochemically plating the via 214 and the trench 306 with the conductive material. The conductive material may overfill the via 214 and the trench 306, e.g. such that the conductive material overlies the top surface 204a of the insulating layer 204. A CMP may be performed to remove excess portions of the conductive material over the insulating layer 204, e.g. such that a top surface 308a of the conductive element 308 is substantially co-planar with the top surface 204a of the insulating layer 204.

As seen in the process flow in FIG. 3A to FIG. 3F, by using the metal layer 208 (which functions as a metal hard mask) and the first metal spacer 304 (which functions as a self-aligned metal spacer), the critical dimension of features formed in the insulating layer 204 can be reduced without the need for a spacer etch back process or for lithography on a spacer, which are needed in a process flow that has a dielectric hard mask and/or a dielectric spacer. Etch back or lithographic processes can adversely affect a profile (e.g. straightness) of the dielectric hard mask and the dielectric spacer and consequently, the critical dimension of features formed below the dielectric hard mask and the dielectric spacer. Therefore, by using the metal layer 208 and the first metal spacer 304 in the process flow shown in FIG. 3A to FIG. 3F, the profile (e.g. straightness) of the metal hard mask and self-aligned metal spacer is preserved, the critical dimension of features (e.g. the via 214 along with the trench 306) formed below the metal hard mask and self-aligned metal spacer is improved, and the process flow can be easily integrated in a manufacturing process.

Figure 4:
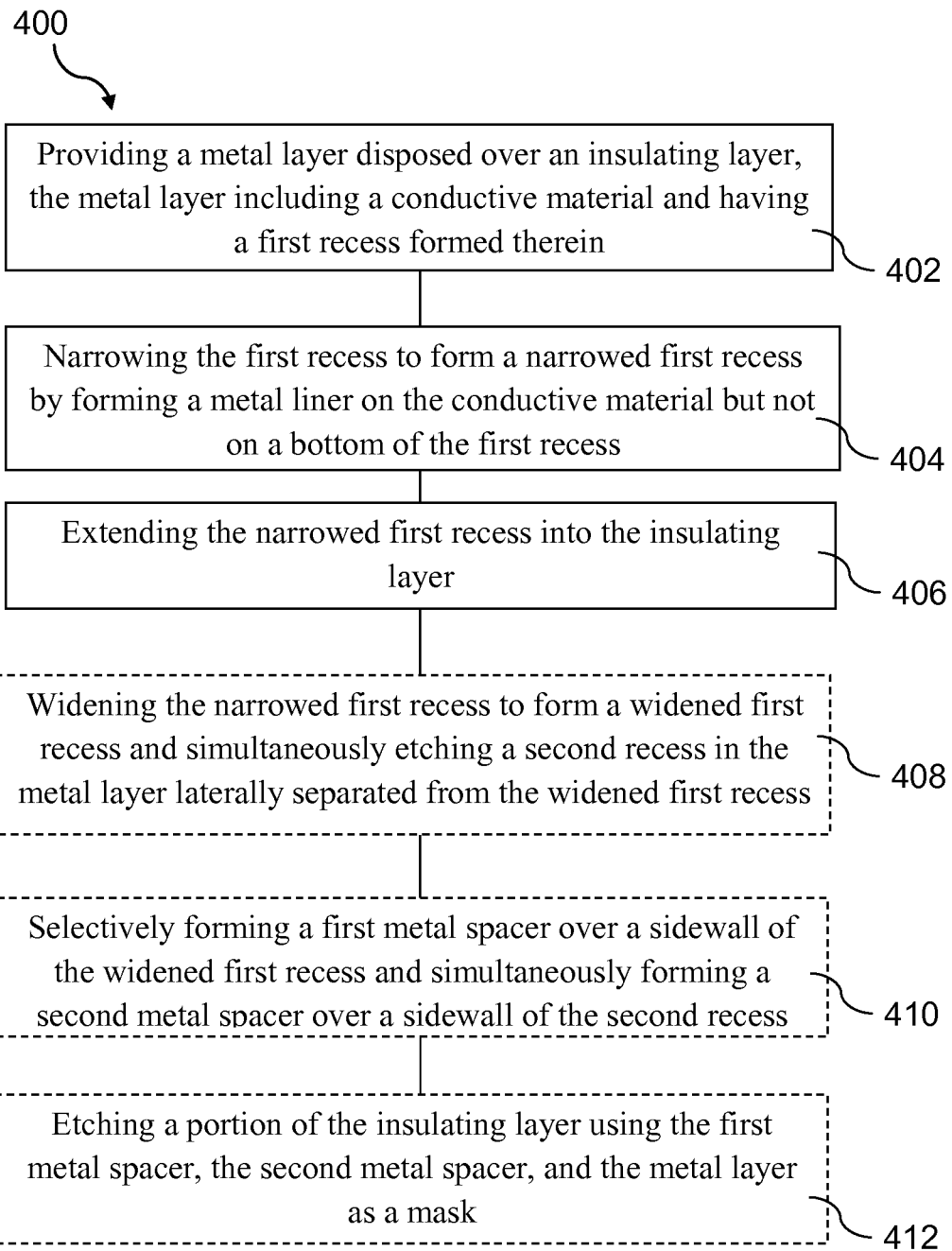
FIG. 4 and FIG. 5 show methods of forming a conductive element in an insulating layer, in accordance with some embodiments.

FIG. 4 shows a method 400 of forming a conductive element in a first recess and a second recess, in accordance with some embodiments. The method 400 may include providing a metal layer disposed over an insulating layer, the metal layer including a conductive material and having a first recess formed therein (in 402); narrowing the first recess to form a narrowed first recess by forming a metal liner on the conductive material but not on a bottom of the first recess (in 404); and extending the narrowed first recess into the insulating layer (in 406). The method 400 may further include widening the narrowed first recess to form a widened first recess and simultaneously etching a second recess in the metal layer laterally separated from the widened first recess (in 408); selectively forming a first metal spacer over a sidewall of the widened first recess and simultaneously forming a second metal spacer over a sidewall of the second recess (in 410); and etching a portion of the insulating layer using the first metal spacer, the second metal spacer, and the metal layer as a mask (in 412).

Figure 5:
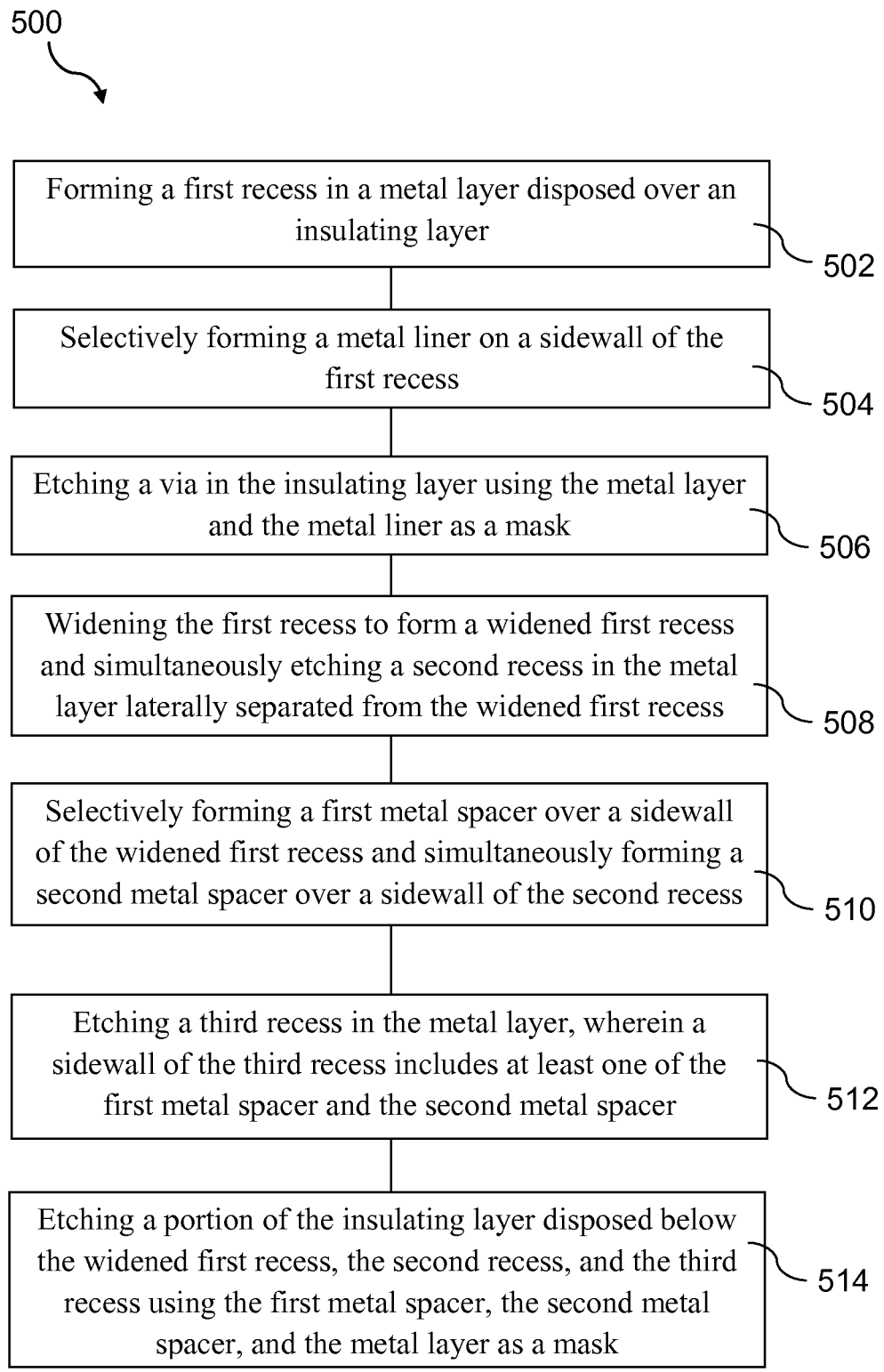

FIG. 5 shows a method 500 of forming a conductive element in a first recess, a second recess, and a third recess, in accordance with some embodiments. The method 500 may include forming a first recess in a metal layer disposed over an insulating layer (in 502); selectively forming a metal liner on a sidewall of the first recess (in 504); etching a via in the insulating layer using the metal layer and the metal liner as a mask (in 506); widening the first recess to form a widened first recess and simultaneously etching a second recess in the metal layer laterally separated from the widened first recess (in 508); selectively forming a first metal spacer over a sidewall of the widened first recess and simultaneously forming a second metal spacer over a sidewall of the second recess (in 510); etching a third recess in the metal layer, wherein a sidewall of the third recess includes at least one of the first metal spacer and the second metal spacer (in 512); and etching a portion of the insulating layer disposed below the widened first recess, the second recess, and the third recess using the first metal spacer, the second metal spacer, and the metal layer as a mask (in 514).

Figure 6A:
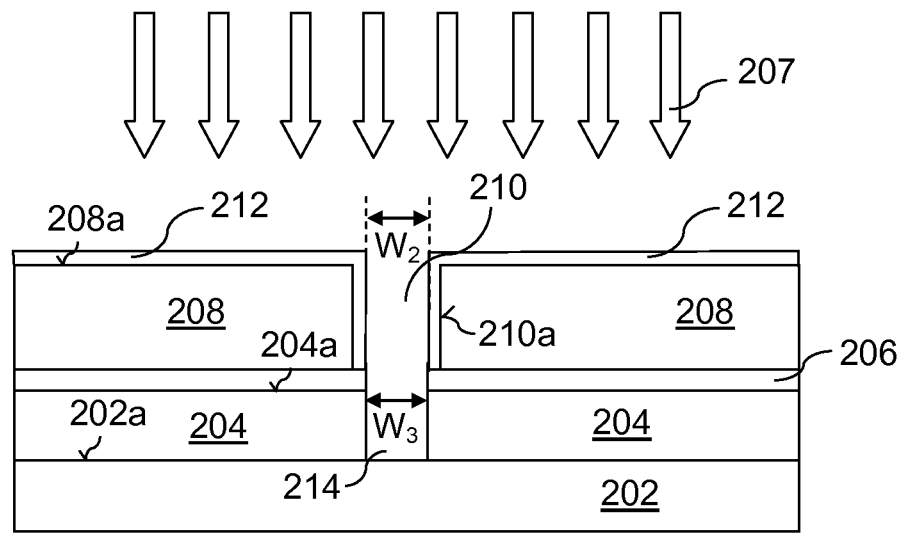
FIG. 6A to FIG. 6N show some of the process steps of the methods shown in FIG. 4 and FIG. 5.
Figure 6B:
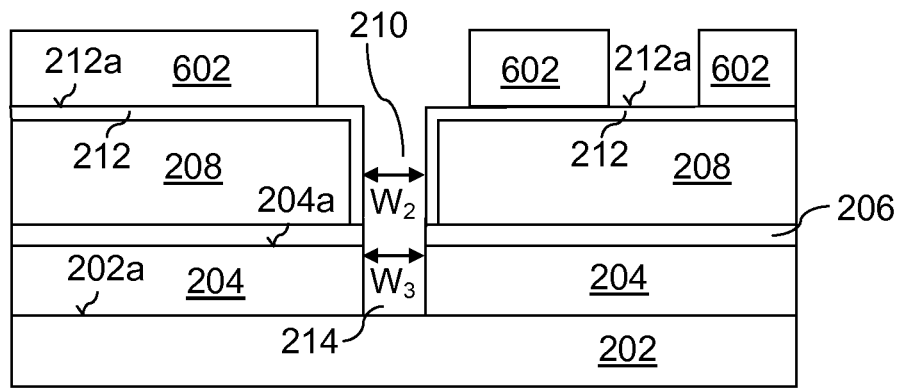
Figure 6C:
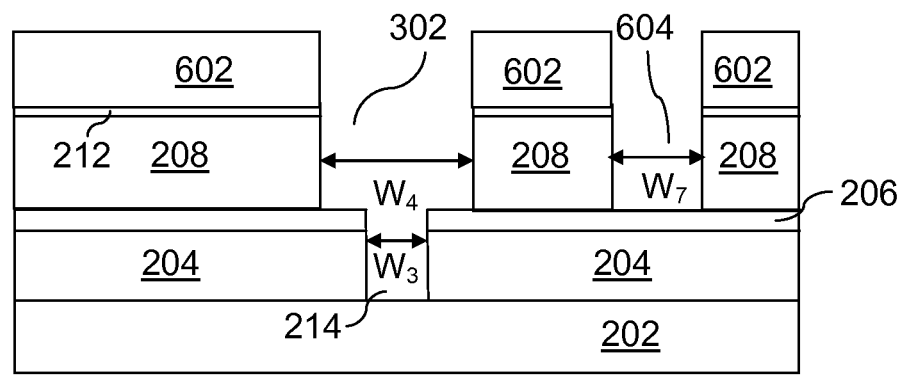
Figure 6D:
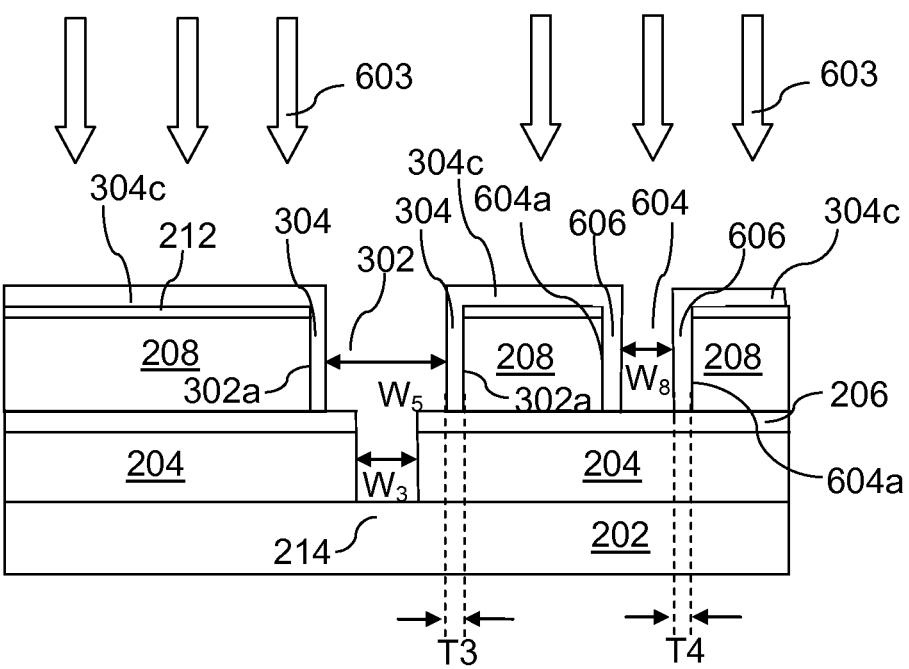
Figure 6E:
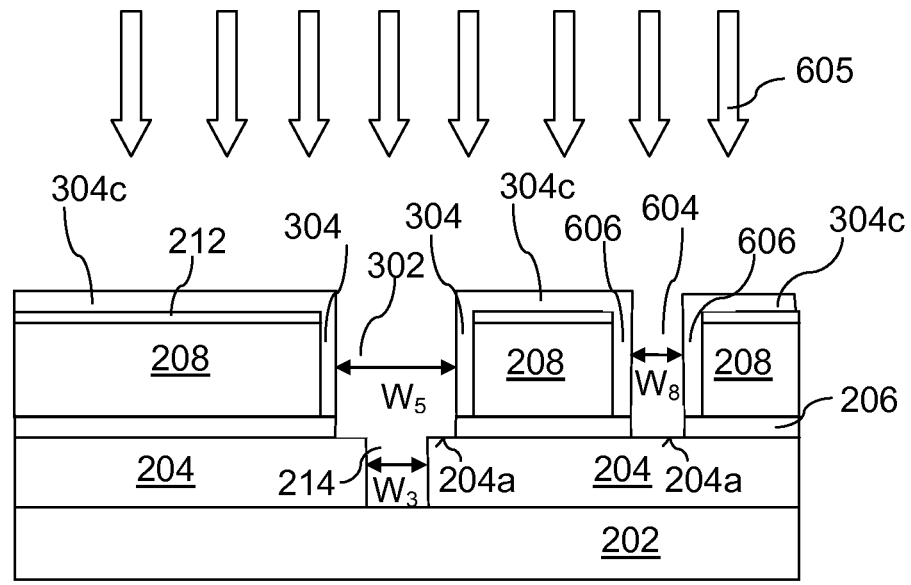
Figure 6F:
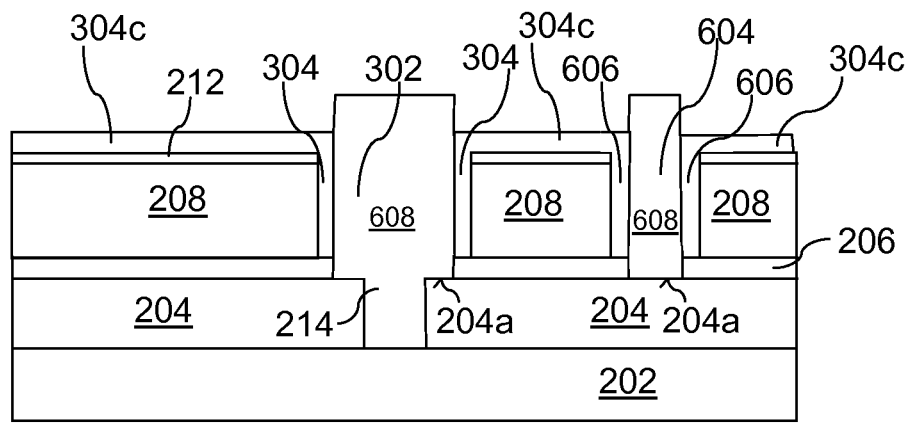
Figure 6G:
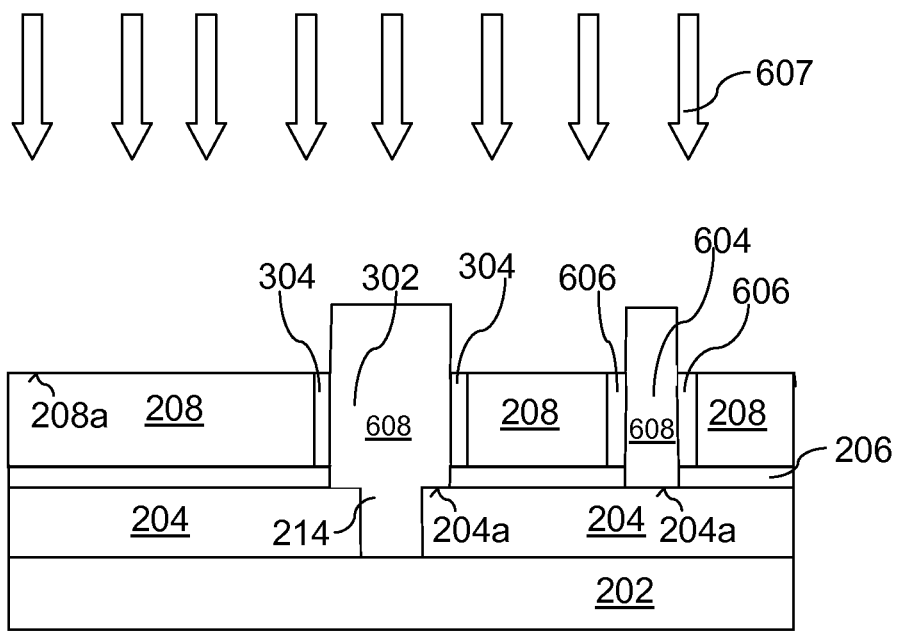
Figure 6H:
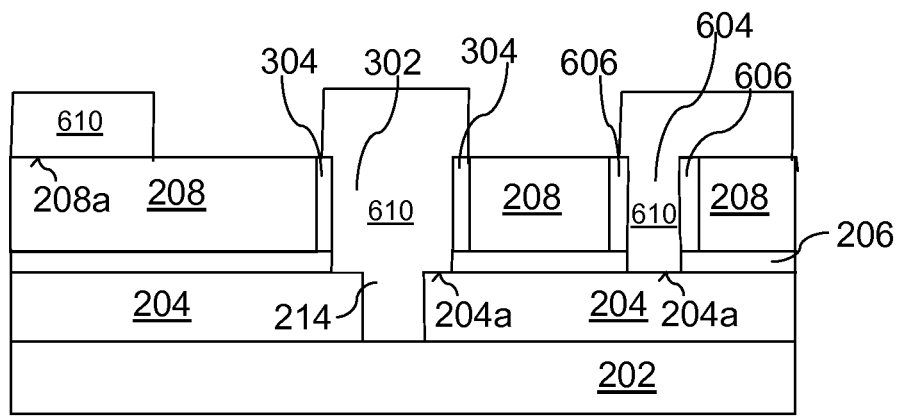
Figure 6I:
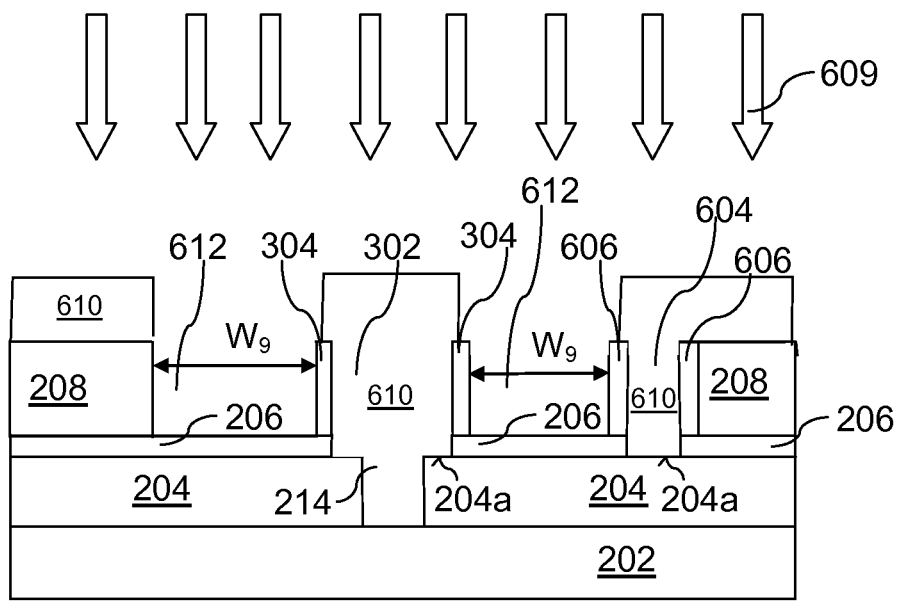
Figure 6J:
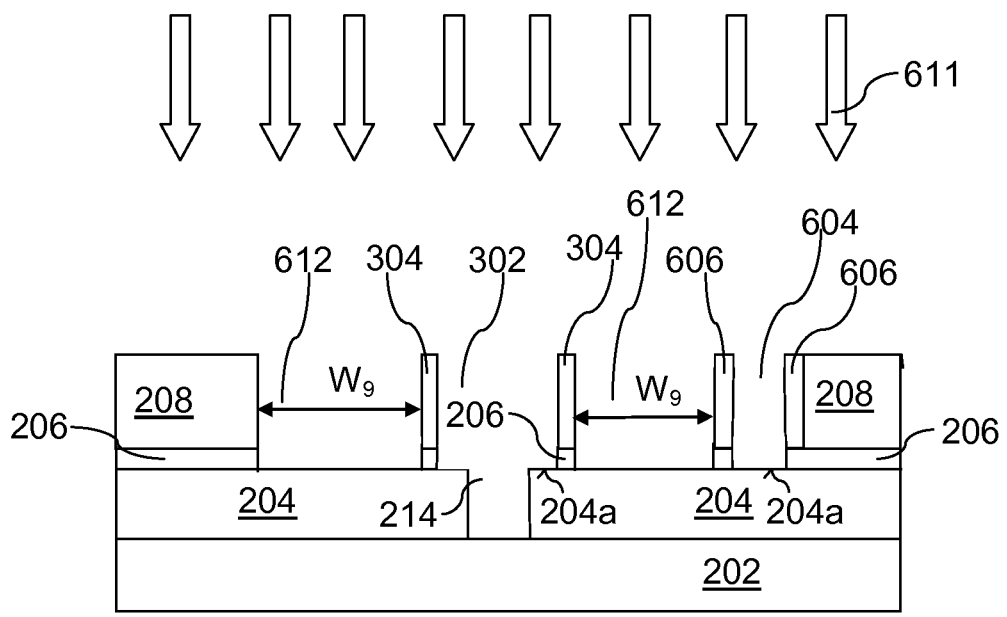
Figure 6K:
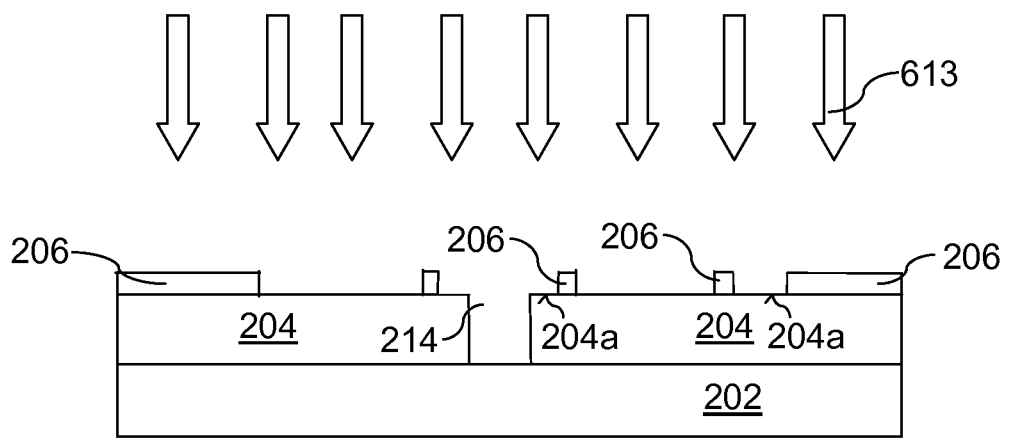
Figure 6L:
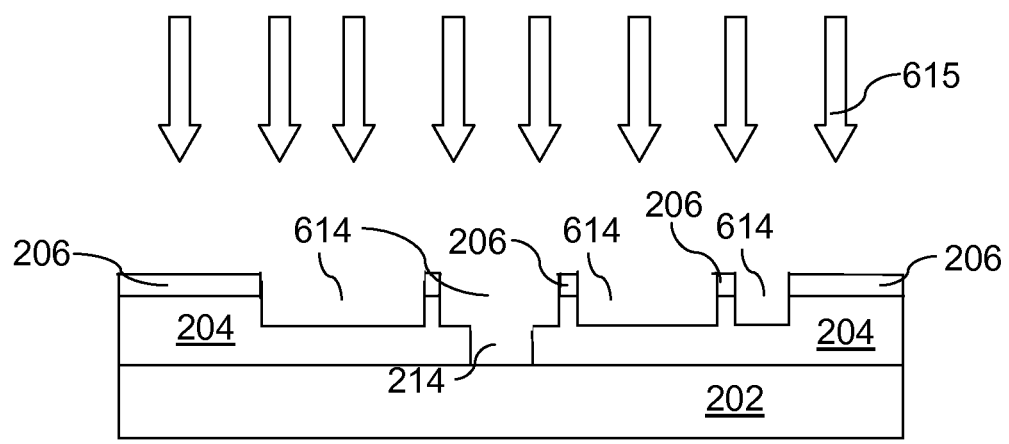
Figure 6M:
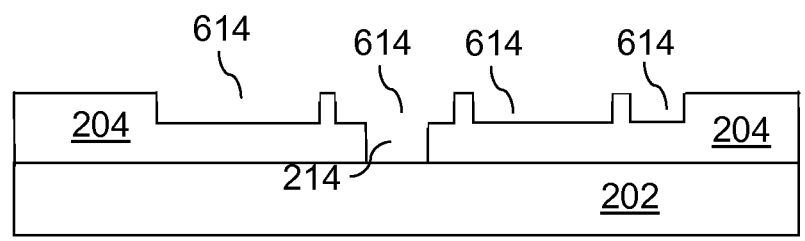
Figure 6N:
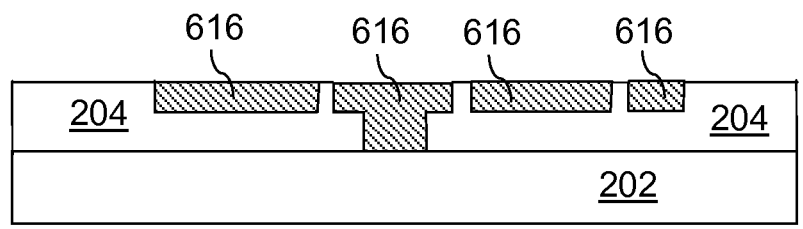

FIG. 6A to FIG. 6N show a process flow illustrating some of the process steps of the method 400 shown in FIG. 4 and the method 500 shown in FIG. 5. FIG. 6A shows the via 214 that may be etched in the insulating layer 204 by the etch process 207, using the metal layer 208 and the metal liner 212 as a mask. FIG. 6A may, for example, be identified with FIG. 2D and FIG. 3A.

FIG. 6B shows a patterned etch mask 602 formed over a portion of the top surface 212a of the metal liner 212. The patterned etch mask 602 may include, or may consist of, a photo-resist material, and may be formed by coating a masking material (e.g. photoresist) over the top surface 212a of the metal liner 212, and patterning the masking material to form the patterned etch mask 602. Patterning the masking material may include, or may consist of, a lithographic process whereby the masking material is exposed to a patterned energy source (e.g., light) and developed.

FIG. 6C shows that the first recess 210 may be widened by an etch process 601 to form the widened first recess 302 having the fourth width $W_4$. In this embodiment, a second recess 604 that is laterally separated from the widened first recess 302 is simultaneously etched in the metal layer 208. The second recess 604 may have a seventh width $W_7$, which may be measured as the distance between opposite sidewalls of the second recess 604. The seventh width $W_7$ may be substantially equal to the first width $W_1$ (see FIG. 2B).

The etch process 601 may, for example, be similar to the etch process 203. The etch process 601 may be applied in cooperation with the patterned etch mask 602 to transfer the pattern of the patterned etch mask 602 to the metal layer 208, thus forming the widened first recess 302 and the second recess 604. The etch process 601 may be applied until a portion of a surface of the etch stop layer 206 is exposed. The etch stop layer 206 may prevent etching of the underlying insulating layer 204 during application of the etch process 601. The patterned etch mask 602 may be removed after forming the widened first recess 302 and the second recess 604.

As shown in FIG. 6D, the first metal spacer 304 may be selectively formed on the sidewalls 302a of the widened first recess 302 by a selective process 603. Simultaneously, a second metal spacer 606 may be selectively formed on sidewalls 604a of the second recess 604. In other words, the first metal spacer 304 and the second metal spacer 606 may be formed on the conductive material of the metal layer 208 and the conductive material of the metal liner 212, but not cover the etch stop layer 206. Stated in yet another way, the first metal spacer 304 and the second metal spacer 606 may only be formed over surfaces of the metal layer 208 and the metal liner 212. The second metal spacer 606 on the sidewall 604a of the second recess 604 may be substantially straight. In other words, the second metal spacer 606 on the sidewall 604a of the second recess 604 may be substantially perpendicular to the underlying etch stop layer 206, as shown in the example of FIG. 6D. The second metal spacer 606 may function as a self-aligned metal spacer during an etch process that may be applied to the insulating layer 204.

A thickness $T_4$ of the second metal spacer 606 may be measured in a lateral direction, e.g. from the sidewall 604a of the second recess 604. The thickness $T_4$ of the second metal spacer 606 may be substantially equal to the thickness $T_3$ of the first metal spacer 304. Selectively forming the second metal spacer 606 on the surfaces of the metal layer 208 and the metal liner 212 may shrink the seventh width $W_7$ by about 20 nm (100 Å×2 sidewalls) to about 60 nm (300 Å×2 sidewalls). Stated differently, by selectively forming the second metal spacer 606 over the surfaces of the metal layer 208 and the metal liner 212, the seventh width $W_7$ may be reduced to an eighth width $W_8$, which may be in a range from about 5 nm to about 30 nm. A width (e.g. a lateral extent) of a feature (e.g. a via) that may be formed in the insulating layer 204 may depend at least in part on the eighth width $W_8$. The second metal spacer 606 may include, or may consist of, similar materials as the first metal spacer 304.

The selective process 603 may include, or may be, a selective deposition and oxidization process. For example, the selective process 603 may include selectively depositing a metal or metal alloy (e.g. containing aluminum or copper)

over the surfaces of the metal layer 208 and the metal liner 212. The deposited metal or metal alloy may subsequently be oxidized (e.g. to form $Al_2O_3$ or $CuO_2$). The oxidization process of the selective process 603 may include, or may be, an anodic metal oxidization process. Process parameters and chemical reagents for the selective process 603 may be similar to the process parameters and chemical reagents of the selective process 303 (described above with respect to FIG. 3C).

FIG. 6E shows that a pattern formed by the first metal spacer 304, the second metal spacer 606, and the metal layer 208 may be transferred to the etch stop layer 206 by an etch process 605. In other words, the etch stop layer 206 may be etched by the etch process 605 using the first metal spacer 304, the second metal spacer 606, and the metal layer 208 as a mask. The etch process 605 may be applied until the top surface 204a of the insulating layer 204 is exposed. The etch process 605 may include at least one chemical reagent for etching through the etch stop layer 206. The at least one chemical reagent of the etch process 605 may, for example, be similar to the at least one first chemical reagent of the etch process 207. Process parameters of the etch process 605 may, for example, be similar to the process parameters for the at least one first chemical reagent of the etch process 207.

As shown in FIG. 6F, the via 214, the widened first recess 302 and the second recess 604 may be filled with a first resist material 608, which may include, or may consist of, a photoresist material. The first resist material 608 may be formed by coating resist material (e.g. photoresist material) within the via 214, the widened first recess 302 and over the conductive layer 304c and patterning the resist material (e.g. by a lithographic process). The first resist material 608 may, for example, protect the first metal spacer 304 and the second metal spacer 606 during a subsequent etch process that may remove the conductive layer 304c and the metal liner 212.

FIG. 6G shows the removal of the conductive layer 304c and the metal liner 212 by an etch process 607 that uses the first resist material 608 as a mask. Consequently, the first metal spacer 304 and the second metal spacer 606 are protected during the etch process 607. The etch process 607 may be applied until the top surface 208a of the metal layer is exposed. The first resist material 608 may be removed after the conductive layer 304c and the metal liner 212 are etched.

The etch process 607 may include an etch process chemistry including, or consisting of, a gaseous etchant. In an embodiment, the gaseous etchant may contain a noble gas, such as argon or helium. In another embodiment, the gaseous etchant may contain fluorine, such as $F_x$ (e.g. $F_2$). In yet another embodiment, the gaseous etchant may contain hydrogen, such as $H_2$ or $CH_x$. A pressure of the gaseous etchant may be in a range from about 100 mT to about 500 mT. The etch process 607 may include provision of electrical power in a range from about 500 Watts to about 2000 Watts for etching through the conductive layer 304c and the metal liner 212.

FIG. 6H shows a second resist material 610 formed within the via 214, the widened first recess 302, the second recess 604 and over a portion of the metal layer 208. The second resist material 610 is formed after removing the first resist material 608, e.g. by an ashing process in combination with a wet clean process. The second resist material 610 may define a mask for a subsequent etching of the metal layer 208. The second resist material 610, which may include, or may consist of, a photoresist material, may be formed by coating a resist material (e.g. photoresist material) within the via 214, the widened first recess 302 and over the metal layer 208 and patterning the resist material (e.g. by a lithographic process, e.g. a photo-lithographic process).

FIG. 6I shows that a third recess 612 may be formed in the metal layer 208 by an etch process 609, using the second resist material 610 as a mask. As shown in FIG. 6I, the second resist material 610 may cover a portion of at least one of the first metal spacer 304 and the second metal spacer 606. This may be because the etch process 609 may preferentially etch material of the metal layer 208, while leaving material of the first metal spacer 304 and the second metal spacer 606 substantially unperturbed. The etch process 609 may be applied until a portion of a surface of the etch stop layer 206 is exposed. The etch process 609 may, for example, be similar to the etch process 203. The second resist material 610 may be removed after forming the third recess 612.

A sidewall of the third recess 612 may include at least one of the first metal spacer 304 and the second metal spacer 606. For example, in the embodiment shown in FIG. 6I, the third recess 612 on the left has the first metal spacer 304 as a sidewall. The third recess 612 on the left also has the metal layer 208 as another sidewall. By way of another example, the third recess 612 on the right has the first metal spacer 304 as a sidewall and the second metal spacer 606 as another sidewall.

The third recess 612 may have a ninth width $W_9$, which may be measured as the widest lateral extent of the third recess 612. For example, the ninth width $W_9$ may be measured as the distance between opposite sidewalls of the third recess 612, as shown in FIG. 6I. While the ninth width $W_9$ may be any suitable size, in a particular embodiment, the ninth width $W_9$ may be substantially equal to the first width $W_1$.

FIG. 6J shows that a pattern formed by the first metal spacer 304, the second metal spacer 606, and the metal layer 208 may be transferred to the etch stop layer 206 by an etch process 611. In other words, the etch stop layer 206 may be etched by the etch process 611 using the first metal spacer 304, the second metal spacer 606, and the metal layer 208 as a mask. The etch process 611 may, for example, be a dry etch process and may be similar to the etch process 605.

As shown in FIG. 6K, the metal layer 208, the first metal spacer 304 and the second metal spacer 606 may be removed by one or more stripping processes 613 to expose the etch stop layer 206. The one or more stripping processes 613 may include one or more chemical reagents to strip the metal layer 208, the first metal spacer 304 and the second metal spacer 606 from the underlying etch stop layer 206. The one or more chemical reagents of the one or more stripping processes 613 may be similar to the one or more chemical reagents of the one or more stripping processes 209. Process parameters of the one or more stripping processes 613 may be similar to process parameters of the one or more stripping processes 209.

As shown in FIG. 6L, a portion of the insulating layer 204 may be etched by an etch process 615, using the etch stop layer 206 as a mask. In other words, a pattern formed by the etch stop layer 206 may be transferred to the insulating layer 204. A result of this may be a plurality of trenches 614 that may be formed in the insulating layer 204.

The etch process 615 may include, or may be, a dry etch process including one or more chemical reagents. The one or more chemical reagents of the etch process 615 may be similar to the second chemical reagent of the etch process 207 described above in respect of FIG. 2D. Process parameters of the etch process 615 may be similar to process parameters related to the second chemical reagent of the etch process 207.

As shown in FIG. 6M, the etch stop layer 206 may be removed (e.g. by a wet strip process including, e.g. hydrogen peroxide). Subsequently, a conductive element 616 may be formed in each trench of the plurality of trenches 614 and in the via 214, as shown in FIG. 6N. The conductive material of the conductive element 616 may be similar to the conductive material of the conductive element 216. The process of forming the conductive element 616 may be similar to the process of forming the conductive element 216.

As seen in the process flow in FIG. 6A to FIG. 6N, by using the metal layer 208 (which functions as a metal hard mask) and the first and second metal spacers 304 and 606 (which function as self-aligned metal spacers), the critical dimension of features formed in the insulating layer 204 can be reduced without the need for a spacer etch back process or for lithography on a spacer, which are needed in a process flow that has a dielectric hard mask and/or a dielectric spacer. Etch back or lithographic processes can adversely affect a profile (e.g. straightness) of the dielectric hard mask and the dielectric spacer and consequently, the critical dimension of features formed below the dielectric hard mask and the dielectric spacer. Therefore, by using the metal layer 208 and the first and second metal spacers 304 and 606 in the process flow shown in FIG. 6A to FIG. 6N, the profiles (e.g. straightness) of the metal hard mask and self-aligned metal spacers are preserved, the critical dimension of features (e.g. the via 214 along with the trenches 614) formed in the insulating layer 204 is improved, and the process flow can be easily integrated in a manufacturing process.

Figure 7:
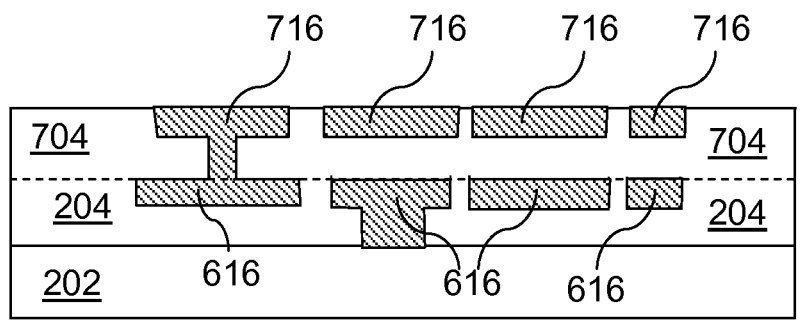
FIG. 7 shows a plurality of conductive element structures formed in a plurality of insulating layers, in accordance with some embodiments.

The conductive elements 616 shown in FIG. 6N may, for example, be a first metallization layer. As shown in FIG. 7, a second insulating layer 704 may be formed on the conductive elements 616 and the insulating layer 204, e.g. by CVD, PVD, spin coating, combinations thereof, or the like. The second insulating layer 704 may include, or may consist of, similar materials as the insulating layer 204. Thereafter, a second metallization layer including one or more second conductive elements 716 may be formed in the second insulating layer 704 using at least one of the method 100 shown in FIG. 1, the method 400 shown in FIG. 4, and the method 500 shown in FIG. 5. The second conductive elements 716 may include, or may consist of, similar materials as the conductive elements 616. This process of depositing an insulating layer and forming one or more conductive elements in the insulating layer may continue until a desired number of metallization layers and insulating layers are formed.

According to various embodiments presented herein, a method is provided. The method may include forming a recess in a metal layer disposed over an insulating layer; selectively forming a metal liner on a sidewall of the recess; and etching a via in the insulating layer using the metal layer and the metal liner as a mask.

According to various embodiments presented herein, a method is provided. The method may include providing a metal layer disposed over an insulating layer, the metal layer including a conductive material and having a first recess formed therein; narrowing the first recess to form a narrowed first recess by forming a metal liner on the conductive material but not on a bottom of the first recess; and extending the narrowed first recess into the insulating layer.

According to various embodiments presented herein, a method is provided. The method may include forming a first recess in a metal layer disposed over an insulating layer; selectively forming a metal liner on a sidewall of the first recess; etching a via in the insulating layer using the metal layer and the metal liner as a mask; widening the first recess to form a widened first recess and simultaneously etching a second recess in the metal layer laterally separated from the widened first recess; selectively forming a first metal spacer over a sidewall of the widened first recess and simultaneously forming a second metal spacer over a sidewall of the second recess; and etching a portion of the insulating layer disposed below the widened first recess and the second recess using the first metal spacer, the second metal spacer, and the metal layer as a mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a recess in a metal layer disposed over an insulating layer;
    selectively forming a metal liner on a sidewall of the recess; and
    etching a via in the insulating layer using the metal layer and the metal liner as a mask.

2. The method of claim 1, wherein the selectively forming the metal liner on the sidewall of the recess comprises selectively plating a metal on the sidewall of the recess.

3. The method of claim 1, wherein the selectively forming the metal liner on the sidewall of the recess comprises selectively depositing a metal on the sidewall of the recess and oxidizing the metal.

4. The method of claim 3, wherein the oxidizing the metal comprises an anodic metal oxidization process.

5. The method of claim 1, further comprising:
    widening the recess to form a widened recess by removing the metal liner on the sidewall of the recess and a portion of the metal layer adjacent to the metal liner;
    selectively forming a metal spacer over a sidewall of the widened recess; and
    etching the insulating layer adjacent to an upper portion of the via using the metal spacer and the metal layer as a mask.

6. The method of claim 5, wherein the selectively forming the metal spacer on the sidewall of the widened recess comprises selectively depositing a metal on the sidewall of the widened recess and oxidizing the metal.

7. The method of claim 6, wherein the oxidizing the metal comprises an anodic metal oxidization process.

8. The method of claim 1, further comprising forming a conductive element within the via.

9. A method, comprising:
    providing a metal layer disposed over an insulating layer, the metal layer comprising a conductive material and having a first recess formed therein;
    narrowing the first recess to form a narrowed first recess by forming a metal liner on the conductive material but not on a bottom of the first recess; and extending the narrowed first recess into the insulating layer.

10. The method of claim 9, wherein the forming the metal liner comprises selectively plating a metal over a sidewall of the first recess but not on the bottom of the first recess.

11. The method of claim 9, wherein the forming the metal liner comprises selectively depositing a metal over a sidewall of the first recess but not on the bottom of the first recess, and oxidizing the metal.

12. The method of claim 9, wherein the metal liner comprises at least one of aluminum, cobalt, titanium, ruthenium, and copper.

13. The method of claim 9, wherein the metal layer comprises at least one of aluminum, cobalt, titanium, and copper.

14. The method of claim 9, wherein a thickness of the metal liner is in a range from about 50 Angstroms to about 150 Angstroms.

15. The method of claim 9, further comprising:
widening the narrowed first recess to form a widened first recess and simultaneously etching a second recess in the metal layer laterally separated from the widened first recess;
selectively forming a first metal spacer over a sidewall of the widened first recess and simultaneously forming a second metal spacer over a sidewall of the second recess; and
etching a portion of the insulating layer using the first metal spacer, the second metal spacer, and the metal layer as a mask.

16. The method of claim 15, wherein a thickness of the first metal spacer and a thickness of the second metal spacer are in a range from about 100 Angstroms to about 300 Angstroms.

17. A method, comprising:
forming a first recess in a metal layer disposed over an insulating layer;
selectively forming a metal liner on a sidewall of the first recess;
etching a via in the insulating layer using the metal layer and the metal liner as a mask;
widening the first recess to form a widened first recess and simultaneously etching a second recess in the metal layer laterally separated from the widened first recess;
selectively forming a first metal spacer over a sidewall of the widened first recess and simultaneously forming a second metal spacer over a sidewall of the second recess; and
etching a portion of the insulating layer disposed below the widened first recess and the second recess using the first metal spacer, the second metal spacer, and the metal layer as a mask.

18. The method of claim 17, wherein the selectively forming the metal liner on the sidewall of the first recess comprises selectively plating a metal on the sidewall of the first recess.

19. The method of claim 17, wherein the selectively forming the first metal spacer and the simultaneously forming the second metal spacer comprises selectively depositing a metal on the sidewall of the widened first recess and the sidewall of the second recess, and oxidizing the metal.

20. The method of claim 17, further comprising:
etching a third recess in the metal layer, wherein a sidewall of the third recess comprises at least one of the first metal spacer and the second metal spacer, wherein the etching the portion of the insulating layer comprises etching a portion of the insulating layer disposed below the widened first recess, the second recess, and the third recess using the first metal spacer, the second metal spacer, and the metal layer as the mask.

* * * * *